United States Patent [19]
Biasse et al.

[11] Patent Number: 5,993,677
[45] Date of Patent: Nov. 30, 1999

[54] PROCESS FOR TRANSFERRING A THIN FILM FROM AN INITIAL SUBSTRATE ONTO A FINAL SUBSTRATE

[75] Inventors: Béatrice Biasse, Uriage; Michel Bruel, Veurey; Marc Zussy, La Tronche, all of France

[73] Assignee: Commissariat a L'Energie Atomique, Paris, France

[21] Appl. No.: 08/781,840

[22] Filed: Jan. 10, 1997

[30] Foreign Application Priority Data

Jan. 25, 1996 [FR] France .................................. 96 00852

[51] Int. Cl.⁶ .................................................. H01L 21/302
[52] U.S. Cl. .............................. 216/36; 216/53; 438/458; 438/691; 438/798; 438/977
[58] Field of Search .................................. 216/33, 34, 36, 216/53; 438/455, 458, 459, 759, 976, 977, 691, 798

[56] References Cited

U.S. PATENT DOCUMENTS

| | | | |
|---|---|---|---|
| 5,391,257 | 2/1995 | Sullivan et al. | 156/630 |
| 5,559,043 | 9/1996 | Bruel | 437/24 |
| 5,580,407 | 12/1996 | Haisma et al. | 156/153 |
| 5,714,395 | 2/1998 | Bruel | 437/24 |
| 5,780,354 | 7/1998 | Dekker et al. | 438/459 |
| 5,856,229 | 1/1999 | Sakaguchi et al. | 438/406 |

FOREIGN PATENT DOCUMENTS

| | | |
|---|---|---|
| 0 533 551 | 3/1993 | European Pat. Off. . |
| 0 665 587 | 8/1995 | European Pat. Off. . |
| 2 725 074 | 3/1996 | France . |

OTHER PUBLICATIONS

Japanese Journal of Applied Physics, Part 2, vol. 23, No. 10, pp. L815–L817, Oct. 1984, Tsuneo Hamaguchi, et al., "Device Layer Transfer Technique Using Chemi–Mechanical Polishing".

9th Symposium on Future Electron Devices—Nov. 14–15, 1990, pp. 267–272, Yoshihiro Hayashi, "Evaluation of Cubic (Cummulatively Bonded IC) Devices".

Primary Examiner—Bruce Breneman
Assistant Examiner—Anita Alanko
Attorney, Agent, or Firm—Oblon, Spivak, McClelland, Maier & Neustadt, P.C.

[57] ABSTRACT

A thin film is transferred from an initial substrate onto a final substrate. The process includes the following successive stages: joining of the thin film (112) onto a handle substrate (120) comprising a cleavage zone, elimination of the initial substrate, joining of the thin film (112) with a final substrate (132), and cleavage of the handle substrate (120) following the cleavage zone. The cleavage zone includes a film of micro-bubbles formed by ion implantation. The invention has, in particular, applications in the fabrication of three-dimensional structures of integrated circuits.

13 Claims, 2 Drawing Sheets

PROCESS FOR TRANSFERRING A THIN FILM FROM AN INITIAL SUBSTRATE ONTO A FINAL SUBSTRATE

TECHNICAL FIELD

This invention relates to a process for transferring a thin film from an initial substrate onto a final substrate.

The expression "thin film" is understood to mean a film whose thickness is of the order of a few micrometers and whose diameter, or another dimension, may attain 100 mm or more.

Thin film transfer has applications particularly in the fabrication of micro-electronic appliances.

The process may, for example, be used for transferring mono-crystalline semiconductor thin films, including electronic circuits, onto a glass plate such as a plate of an active matrix flat display screen.

Thin film transfer may also have applications in the fabrication of three-dimensional structures of integrated circuits.

PRIOR ART

A thin film, in the meaning used for the purposes of this invention, is too small and fragile to be transported as it is.

Thus, if the film is to be transported, in particular from an initial substrate to a final substrate, it must be joined to a transfer substrate presenting a thickness of several hundreds of microns.

With such a substrate it is now possible to manipulate the thin film. This substrate may be said to fill the role of a "handle" and will in fact be referred to as "handle substrate" in the ensuing text.

FIGS. 1 to 5 illustrate a known process for transferring a thin film from an initial substrate onto a final substrate without turning over the thin film.

FIG. 1 shows the initial substrate 10 and the thin film 12.

The thin film in which, for example, electronic circuits have been made, is joined to the substrate 10 by a first face 14. A second face 16 of the thin film 12, opposite the first face 14, is free.

A handle substrate 20 is stuck on the second face 16 of the thin film in order to obtain the structure illustrated in FIG. 2.

FIGS. 3 and 4 show successively the elimination of the initial substrate 10 and the sticking of the first face of the thin film 12 onto a face 30 of the final substrate 32.

The initial substrate is eliminated, for example by mechanical abrasion.

Finally, a last stage of the known process, represented in FIG. 5, consists of the elimination of the handle substrate.

The handle substrate is totally destroyed by mechanical abrasion or by etching. It may also be eliminated by a combination of these two means. The structure illustrated in FIG. 5 is obtained with final substrate 32 and thin film 12.

The document (1) whose references are given at the end of this description may usefully be consulted with regard to this process and the elimination of the handle substrate.

However, there are a certain number of limitations to the process described above.

Indeed, the mechanical abrasion of the handle substrate, whose thickness may be of the order of 500 $\mu$m or more, often necessitates several hours of treatment. This treatment is liable to damage the thin film and/or the circuits made within it.

Moreover, the handle substrate is destroyed in the course of its elimination and cannot therefore be used for another transfer operation.

One aim of this invention is to propose a process for transferring a thin film without turning it over, by means of a handle substrate, in which the handle substrate is not destroyed and may be used again.

Another aim of this invention is to propose a process for transferring a thin film in which the thin film is not subjected to heavy stress during the elimination of the handle support.

DISCLOSURE OF THE INVENTION

With a view to attaining the objectives mentioned above, the invention more specifically relates to a process for transferring a thin film from an initial substrate onto a final substrate by the intermediary of a substrate referred to as handle substrate, the thin film presenting a first face joined to the initial substrate and a second, opposite, free, face, characterized in that it comprises the following successive stages:

joining of the thin film by its free face with a superficial film of the handle substrate, the superficial film of the handle substrate being joined to a solid part of the handle substrate by the intermediary of a cleavage zone, elimination of the initial substrate, joining of the first face of the thin film with a face of the final substrate, cleavage of the handle substrate following the cleavage zone.

The thin film may contain active elements, in which case this film is of a semiconducting material and the active elements are made before the phase of joining with the handle substrate.

Cleavage thus makes it possible to eliminate the solid part of the handle substrate. Only the superficial film of the handle substrate is left on the second face of the thin film. This superficial film, which is very fine, may in certain cases be left in place on the thin film. In this case, for example, it plays the part of a passivation layer of the thin film.

The superficial film may also be eliminated by etching or any other appropriate technique.

Thus, thanks to the invention process, the thin film is not submitted to great stress, and in particular it is not submitted to the stresses of a treatment by mechanical abrasion.

The joining of the thin film with the handle substrate, as well as the joining of the thin film onto the final substrate may be carried out either by adhesive sticking, by means of a glue, or by direct sticking, in other words without an adhesive compound. These operations are explained in greater detail at a later stage of this description.

According to another aspect of the invention, the initial substrate may be eliminated by detaching it from the thin film or by destroying it.

A clearer understanding of other characteristics and advantages of this invention will emerge from the ensuing description, which is given for purely illustrative and non-limitative purposes, and from the accompanying drawings.

DISCLOSURE OF REALIZATION MODES OF THE INVENTION

In the ensuing description, elements of FIGS. 6A, 6B and 7 to 10, identical or similar to elements of FIGS. 1 to 5, carry the same references, with the addition of the value 100.

Figure 1:
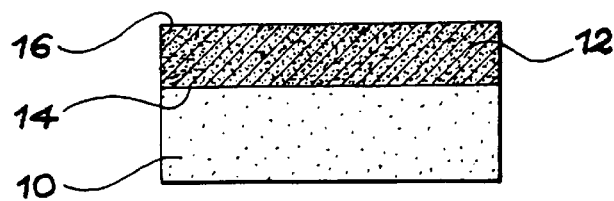
FIGS. 1 to 5 are schematic sections of structures comprising a thin film and illustrate different stages of a known process for transferring a thin film from an initial substrate towards a final substrate.
Figure 2:
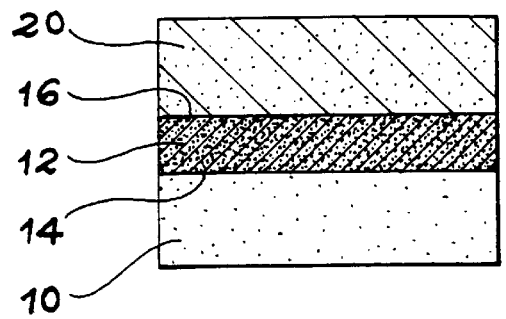
Figure 3:
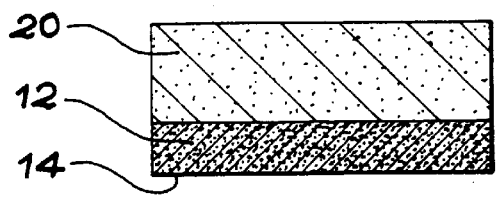
Figure 4:
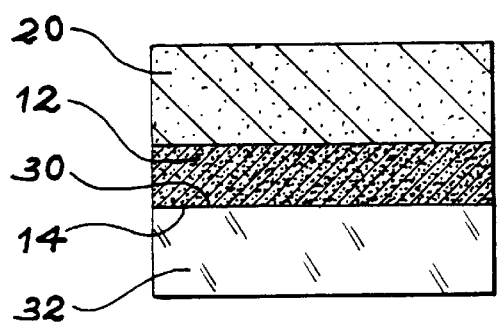
Figure 5:
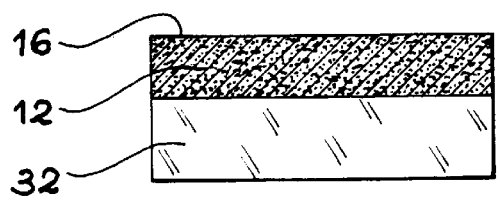
Figure 6A:
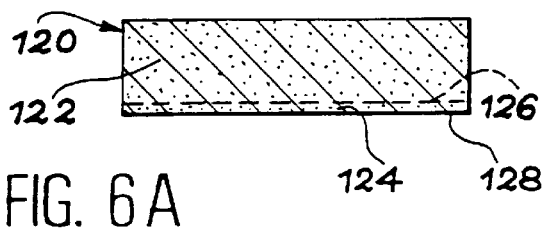
FIG. 6A is a schematic section of a substrate, referred to as a handle substrate, such as used in the invention process.

As is shown in FIG. 6A, the handle substrate 120 used in the invention process presents a solid part 122 and a superficial film 124. The solid part and the superficial film are separated by a cleavage zone 126.

The cleavage zone is obtained, for example, by implanting, through a face 128 of the substrate 120, hydrogen $H^+$ ions at a dose above $3.10^{16}$ cm$^-$ and an energy below 50 keV. These implanted ions form, at the mean penetration depth of the ions, a film of gaseous micro-bubbles which defines the cleavage zone 126.

When the handle substrate 120 is in silicon, with the values indicated for the implantation and energy dose, the cleavage zone is situated at a depth of the order of 0.5 $\mu$m of the face 128 of the substrate. This therefore corresponds to the thickness of the superficial film 124.

With regard to the fabrication of a cleavage zone by ionic implantation of inert gas or hydrogen ions, the document (2) whose references are given at the end of this description may usefully be consulted.

Figure 6B:
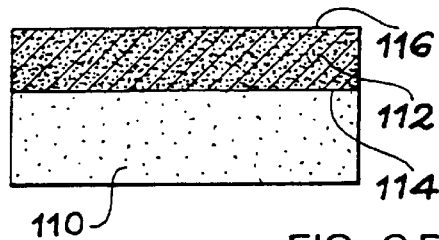
FIG. 6B is a schematic section of a structure including the initial substrate and a thin film, such as used in the invention process.

FIG. 6B shows the initial substrate 110 and the thin film. It is similar to the previously described FIG. 1. The thin film presents a first face 114 which is joined to the substrate and a second, free, face 116.

The structure made up of the initial substrate 110 and the thin film may be of the SOI (silicon on insulator) type. In this case, it includes a fine film of silicon, containing, if required, integrated circuits, and forming the said thin film, a film of silicon oxide which may be considered as also forming part of the thin film, and a solid part of silicon which constitutes the initial substrate.

Figure 7:
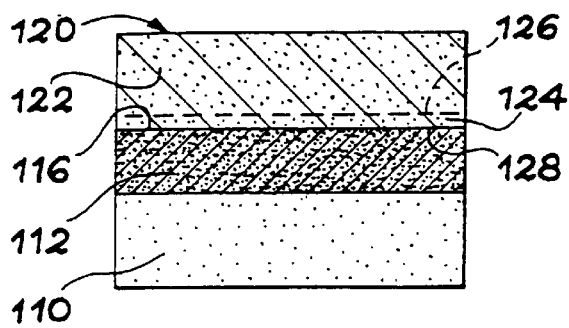
FIGS. 7 to 10 are schematic sections of structures including the thin film and illustrating stages of the invention process.

FIG. 7 illustrates the stage of joining the handle substrate 120 onto the structure comprising the initial substrate 110 and the thin film 112.

The superficial film 124 of the substrate 120 is stuck onto the face 116 of the thin film.

Sticking may be adhesive, that is to say by means of a glue which is resistant to high temperatures.

Sticking may also be direct, in which case the faces 116 and 128 are prepared by mechanical-chemical polishing and/or chemical cleaning.

The surfaces prepared in this way are placed in contact with each other and the structure obtained is annealed under nitrogen atmosphere.

The annealing temperature is chosen so as to obtain a good mechanical strength of the unit formed by the handle substrate and the thin film. It is, however, chosen sufficiently low so as not to damage any integrated circuits formed in the thin film. For example, if the thin film contains conductive parts in aluminum, the annealing temperature should not exceed 450° C.

Similarly, the annealing temperature should be chosen so as not to cause a premature cleavage of the handle substrate 120. As an example, the annealing is carried out at a temperature of the order of 350° C.

Figure 8:
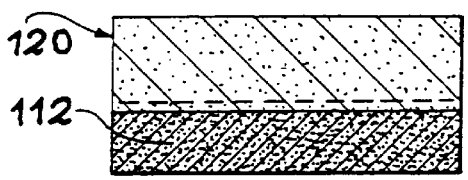

An ensuing stage of the process is the elimination of the initial substrate. This stage is illustrated by FIG. 8.

Several possibilities may be envisaged for implementing this stage of the invention.

When the joining of the handle substrate with the thin film is carried out with a liaison energy which is greater than the liaison energy between the thin film and the initial substrate, the initial substrate may be detached by tearing.

For this purpose, opposite tensile forces are exerted on the initial substrate and the handle substrate, which said forces are capable of causing a tearing of the initial substrate along the first face of the thin film.

According to an alternative implementation of the invention, a film of sacrificial material may be provided in the initial substrate. This film is preferably provided on the face of the initial substrate which is in contact with the first face 114 of the thin film, in other words at the interface of the initial substrate and the thin film.

Elimination by chemical method of this sacrificial film frees the initial substrate which may, if required, be reused. The document (3) whose references are given at the end of this description may usefully be consulted in this connection.

According to another alternative, the initial substrate may also be totally destroyed by mechanical abrasion, by etching or else by a combination of these two means.

For example, when the initial substrate is of the SOI type, its elimination includes a mechanical abrasion, that is to say a lapping or a rectification of the solid part of silicon. Next, a chemical attack by TMAH (Tetra Methyl Ammonium Hydroxide) eliminates the remaining thickness of silicon which is of the order of a few tenths of microns. Preferably, during this etching, the silicon oxide film of the SOI structure acts as a stop layer for etching.

Figure 9:
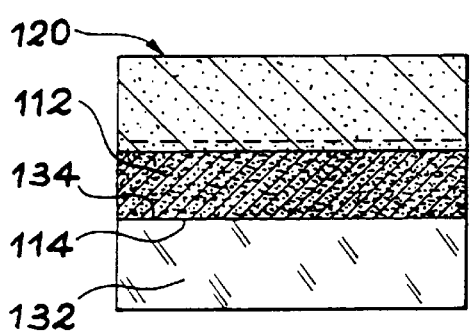

FIG. 9 shows the structure obtained after joining of the first face 114 of the thin film with the superficial face 134 of the final substrate 132. The final substrate 132 is, for example, a glass plate. As with the joining of the handle substrate on the thin film, it is possible to carry out either an adhesive sticking with glue or a direct sticking for the joining with the final substrate.

Direct. sticking includes preparing the faces 114 and 134 by mechanical-chemical polishing and/or chemical cleaning, placing these surfaces in contact with each other and, if required, annealing under nitrogen atmosphere of the structure thus obtained.

The annealing, which is carried out at a temperature of the order of 350° C., improves adhesion.

An ensuing stage of the invention process is the elimination of the handle substrate which is carried out by cleavage in the cleavage zone 126 (see FIG. 6A).

Figure 10:
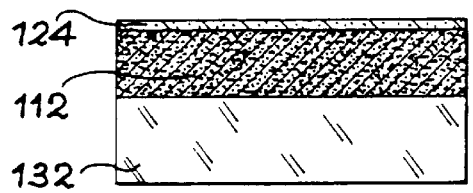

The cleavage of the handle substrate is prompted by a thermal treatment. This thermal treatment provokes a separation of the solid part of the superficial film by a crystalline rearrangement effect in the handle substrate and by a pressure effect in the gaseous micro-bubble film. In this way the structure represented in FIG. 10 is obtained, in which said structure only the superficial film 124 of the handle substrate remains on the face 116 of the thin film.

The thermal treatment may be common with the annealing corresponding to the sticking of the thin film onto the final substrate.

The conditions of thermal treatment and/or sticking annealing, that is to say their temperature and their duration, are chosen so as to be sufficient to cause cleavage and to obtain a good mechanical strength of the thin film on the final substrate.

However, the temperature chosen is low enough not to damage any electronic circuits or appliances formed in the thin film.

For example, the thermal treatment may be carried out at 450° C. for 30 minutes.

Cleavage may be completed by an etching stage in order to eliminate the superficial film 124 remaining on the thin film. It may, for example, be eliminated by a TMAH etching.

In certain cases, the film 124 may also be preserved as a passivation layer of the thin film.

DOCUMENTS CITED IN THIS APPLICATION

1) Evaluation of cubic (cumulatively bonded IC) devices by Y. HAYASHI, 9th Symposium on future electron devices, Nov. 14–15, 1990, pages 267–272

2) FR-A-2 681 472

3) FR-A-2 715 503

We claim:

1. A process for transferring a thin film (112) from an initial substrate (110) onto a final substrate (132) by a handle substrate (120), the thin film having a first face (114) joined to the initial substrate (110) and a second, opposite, free, face (116), comprising the following successive stages:

joining the thin film by its free face (116) with a superficial film (124) of the handle substrate (120), the superficial film (124) of the handle substrate being joined to a solid part (122) of the handle substrate (120) by the intermediary of a cleavage zone (126), wherein the cleavage zone (126) comprises a film of microbubbles;

eliminating the initial substrate (110);

joining the first face (114) of the thin film (112) with a face (134) of the final substrate (132); and cleaving the handle substrate (120) along the cleavage zone (126).

2. The process according to claim 1, wherein the superficial film (124) of the handle substrate remaining in contact with the second face (116) of the thin film (112) after said cleaving is also eliminated.

3. The process according to claim 1, wherein the initial substrate (110) is eliminated by at least one means selected from the group consisting of mechanical abrasion and etching.

4. The process according to claim 3, wherein said initial substrate (110) is silicon and is linked to the thin film (112) by a silicon oxide intermediary film, and wherein the initial substrate (110) is eliminated successively by:

a mechanical abrasion, and an etching wherein the silicon oxide intermediary film acts as a stop layer for said etching.

5. The process according to claim 1, wherein the initial substrate (110) is eliminated by detaching it from the thin film (112) along its first face (114).

6. The process according to claim 5, wherein the initial substrate (110) is detached by exerting, on the initial substrate and the handle substrate (120), opposite tensile forces capable of provoking a tearing of the initial substrate along the first face (114) of the thin film (112).

7. The process according to claim 5, wherein the initial substrate (110) is detached by eliminating a surface sacrificial film from the initial substrate, in contact with the first face of the thin film.

8. The process according to claim 1, wherein the joining of the thin film (112) on the handle substrate (120) comprises:

the mechanical-chemical polishing and/or chemical cleaning of one face (128) of the superficial film (124) of the handle substrate (120), the placing into contact of the second face (116) of the thin film (112) and of the face (128) of the superficial film (124) of the handle substrate, and the annealing of the structure thus obtained.

9. A process according to claim 1, wherein the joining of the thin film (112) on the final substrate (132) comprises:

the mechanical-chemical polishing and/or chemical cleaning of the first face (114) of the thin film (112) and of the said face (134) of the final substrate, the placing of the said faces (114, 134) in contact with each other, and the annealing of the structure thus obtained.

10. The process according to claim 8, wherein the annealing is carried out at a temperature of the order of 350° C.

11. The process according to claim 1, wherein at least one of the joinings of the thin film (112) on the handle substrate (120) and of the thin film (112) on the final substrate (132) is an adhesive sticking making use of a glue.

12. The process according to claim 1, wherein said cleaving comprises a thermal cleavage treatment in order to cause a separation of the solid part (122) and superficial film (124) of the handle substrate (120) along a film of microbubbles comprised within the cleavage zone (126).

13. The process according to claim 1, wherein the joining of the thin film (112) on the final substrate (132) comprises:

mechanical-chemical polishing and/or chemical cleaning of the first face (114) of the thin film (112) and of the said face (134) of the final substrate, placing the said faces (114, 134) in contact with each other, and annealing the structure thus obtained, wherein said cleaving comprises a thermal cleavage treatment in order to cause a separation of the solid part (122) and superficial film (124) of the handle substrate (120) along a film of micro-bubbles comprised within the cleavage zone (126), and wherein said annealing comprises said thermal cleavage treatment.

* * * * *